United States Patent
Teeter

(10) Patent No.: US 11,672,104 B2
(45) Date of Patent: Jun. 6, 2023

(54) CHANGING AIR FLOW DIRECTION

(71) Applicant: DELL PRODUCTS L.P., Round Rock, TX (US)

(72) Inventor: Victor B Teeter, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 16/687,671

(22) Filed: Nov. 18, 2019

(65) Prior Publication Data
US 2020/0093035 A1  Mar. 19, 2020

Related U.S. Application Data

(62) Division of application No. 15/002,151, filed on Jan. 20, 2016, now Pat. No. 10,517,194.

(51) Int. Cl.
H05K 7/20 (2006.01)

(52) U.S. Cl.
CPC ............... H05K 7/20727 (2013.01)

(58) Field of Classification Search
CPC .. H05K 7/20; H05K 7/20136; H05K 7/20172; H05K 7/20209; H05K 7/20727; H05K 7/20836; F24F 11/72; F24F 11/79
USPC ....... 165/11.1; 454/184, 228, 229, 230, 234, 454/235
See application file for complete search history.

(56) References Cited

U.S. PATENT DOCUMENTS

| | | | | |
|---|---|---|---|---|
| 5,528,229 A * | 6/1996 | Mehta | ..................... | F24F 7/007 340/3.4 |
| 8,706,315 B2 * | 4/2014 | Sato | ................... | H05K 7/20836 700/300 |
| 9,192,076 B2 * | 11/2015 | Artman | .............. | H05K 7/20209 |
| 9,788,456 B2 * | 10/2017 | Rodriquez | .............. | H05K 7/20 |
| 9,903,381 B2 * | 2/2018 | Liu | ............ | H02P 6/30 |
| 2004/0244575 A1 * | 12/2004 | Fatemi | .................... | F15B 20/00 91/459 |
| 2006/0097675 A1 * | 5/2006 | Hsu | ...................... | H04N 9/3141 318/280 |
| 2009/0208333 A1 * | 8/2009 | Smith | .................. | F04D 29/601 416/5 |
| 2010/0110632 A1 * | 5/2010 | Rose | ................... | H05K 7/20727 361/695 |
| 2010/0314941 A1 * | 12/2010 | Schulzman | ........... | F04D 25/088 307/40 |
| 2012/0086379 A1 * | 4/2012 | Horng | ..................... | G06F 1/206 318/472 |
| 2012/0253592 A1 * | 10/2012 | Senthil | ............... | G05D 23/1931 701/36 |

(Continued)

*Primary Examiner* — Len Tran
*Assistant Examiner* — Gustavo A Hincapie Serna
(74) *Attorney, Agent, or Firm* — North Weber & Baugh LLP

(57) ABSTRACT

Embodiments of the present disclosure include systems and methods for controlling the direction of cooling air flow across components of an electronic devices. In one or more embodiments, a device or information handling system includes an air flow generator that is able to generate air flow in different directions by activation of a button, a controller, or both. In one or more embodiments, a sensor measures air temperatures of air when the air flows in different directions, and an air flow direction is selected using the air temperature measurements.

20 Claims, 7 Drawing Sheets

(56) References Cited

U.S. PATENT DOCUMENTS

| | | | | |
|---|---|---|---|---|
| 2014/0227085 A1* | 8/2014 | Yu | ........................ | F04D 25/105 |
| | | | | 415/148 |
| 2015/0105009 A1* | 4/2015 | Alshinnawi | .......... | H05K 7/2029 |
| | | | | 454/184 |
| 2015/0127188 A1* | 5/2015 | Mundt | .................. | F04D 19/007 |
| | | | | 415/68 |
| 2015/0354847 A1* | 12/2015 | Breu | ........................ | F24F 11/38 |
| | | | | 165/11.1 |
| 2016/0007506 A1* | 1/2016 | Karasawa | .......... | H05K 7/20736 |
| | | | | 361/679.48 |
| 2016/0047609 A1* | 2/2016 | Gauthier | .............. | B60H 3/0633 |
| | | | | 165/303 |
| 2016/0161960 A1* | 6/2016 | Yamada | .................. | F24F 11/61 |
| | | | | 700/277 |
| 2016/0178266 A1* | 6/2016 | Malwitz | .................... | H02P 1/00 |
| | | | | 62/89 |
| 2016/0239005 A1* | 8/2016 | Hoshi | .................... | G08C 17/02 |

\* cited by examiner

CHANGING AIR FLOW DIRECTION

CROSS-REFERENCE TO RELATED APPLICATIONS

This patent application is a divisional of and claims the priority benefit of co-pending and commonly-owned U.S. patent application Ser. No. 15/002,151, filed on 20 Jan. 2016, entitled "CHANGING AIR FLOW DIRECTION ON AIR-COOLED ELECTRONIC DEVICES," which patent document is incorporated by reference herein in its entirety and for all purposes.

BACKGROUND

A. Technical Field

The present invention relates to controlling the temperature of electronic devices, more particularly, to systems and methods for controlling the direction of air flow across components of air-cooled electronic devices.

B. Description of the Related Art

There often arises a need to control the direction of the air flow across components of air-cooled electronics. It is quite common when an air-cooled device is installed in an equipment rack (or, shortly, rack) with other air-cooled electronics in a computer room or data center. FIG. 1 shows a schematic diagram 100 of conventional racks in an air-conditioned computer room. As depicted, two rows of racks, 104 and 106 are located on a floor 102, where each rack (e.g., 106a) may accommodate multiple electronic devices (or, equivalently, equipment) (e.g., 106a1-106a3). An air conditioning (AC) unit (not shown in FIG. 1) may send cold air through the duct 140 under the floor 102. Then, as indicated by arrows 108, the cold air exits the duct 140 through the vents 103 on the floor.

For efficiency in cooling the racks 104 and 106, the preferred method of racking the equipment is to pull in cooler air from the aisle 150 and discharge warmer air to the adjacent aisle 152 (or 154), as indicated by the arrows 110 (or 111). This method may be preferred, but extremely difficult to achieve due to many factors standing in the way of proper cooling of equipment: (1) when a network switch is installed in a rack, there may be usually more concern about which direction the devices should be facing than which direction the air flow should be for proper cooling. This is because it is common for a rack to have over a hundred cables coming out of one or both sides of the rack (the majority of them from network switches), making cable management another substantial issue that is easier to both see and quantify. It is often desirable for the user to position the equipment into the rack to make cabling easier in the present and future, regardless of the impact it has on cooling and cooling costs. (2) The user may not think about the air flow direction until long after having installed the equipment into the rack. (3) The equipment may be already in place and the user may think it is not feasible to re-position the equipment. (4) There may be a need to schedule company downtime in order to make the necessary equipment changes. (5) In cases where there are no hot/cold aisles, the user may not take the time to find out which direction the air flow should be. (6) Changes in the conditions of ambient temperatures surrounding the equipment can occur when additional equipment is installed nearby, when a vent/duct is inadvertently blocked, when furniture or other objects are moved, when an air conditioner fails, etc.

For the purpose of illustration, the device/equipment 106a 2 is assumed to be installed in such a manner that the device 106a 2 takes warm air in the aisle 154 and discharges hot air into the aisle 150, as indicated by the arrow 112. The hot air discharged from a device should be on its way back to the AC unit to be re-cooled; instead, as indicated by the arrow 114, the hot air from the device 106a2 continues to circulate back to the racks 106a-106e (and/or 104a-104e), causing drastic inefficiencies in cooling. What further can exacerbate the problem is that the electronic industry is manufacturing increasingly dense components that are more sensitive to temperature.

If the device 106a 2 has a mechanism to reverse the air flow, the cooling efficiency would increase significantly. There is currently no easy or fast way to reverse the air flow 112. On equipment already in a production environment, few users are willing to order new fans that can reverse air flow and wait on them to ship just to reverse the air flow at a later data. In some cases, the new fans may not be installed in the devices/racks for one or more of reasons set forth above. As such, there is a need for systems and methods for control the direction of air flow across a device/equipment of air-cooled electronics.

BRIEF DESCRIPTION OF THE DRAWINGS

References will be made to embodiments of the present disclosure, examples of which may be illustrated in the accompanying figures. These figures are intended to be illustrative, not limiting. Although the disclosure is generally described in the context of these embodiments, it should be understood that it is not intended to limit the scope of the disclosure to these particular embodiments. Items in the figures may not be to scale.

DETAILED DESCRIPTION OF THE PREFERRED EMBODIMENTS

Figure 1:
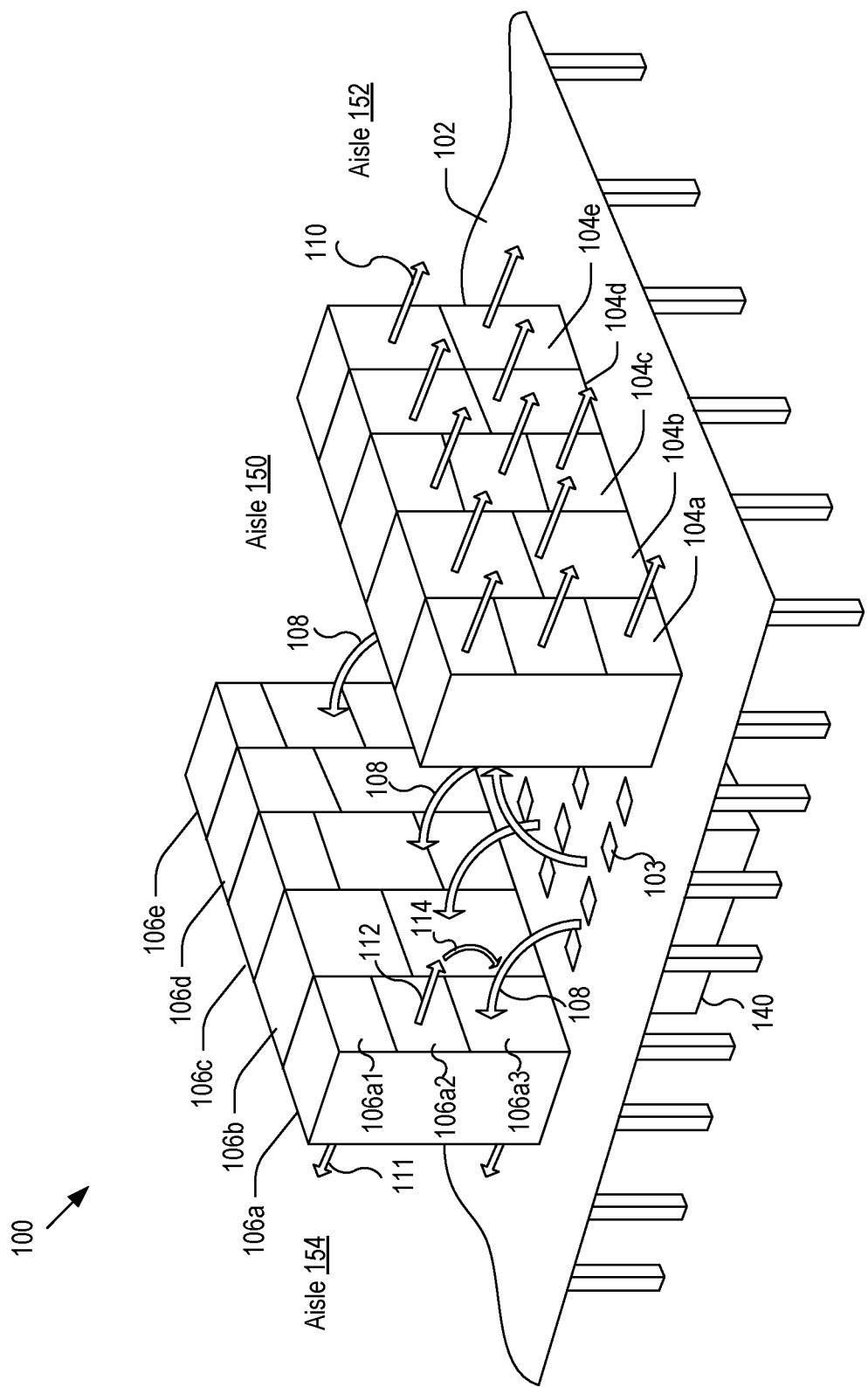
FIG. 1 shows a conventional arrangement of racks in an air-conditioned computer room.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

Elements/components shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components/elements. Components/elements may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled" "connected" or "communicatively coupled" shall be understood to include direct connections, indirect connections through one or more intermediary devices, and wireless connections.

Furthermore, one skilled in the art shall recognize that: (1) certain steps may optionally be performed; (2) steps may not be limited to the specific order set forth herein; and (3) certain steps may be performed in different orders; and (4) certain steps may be done concurrently.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims.

Furthermore, the use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

Figure 2A:
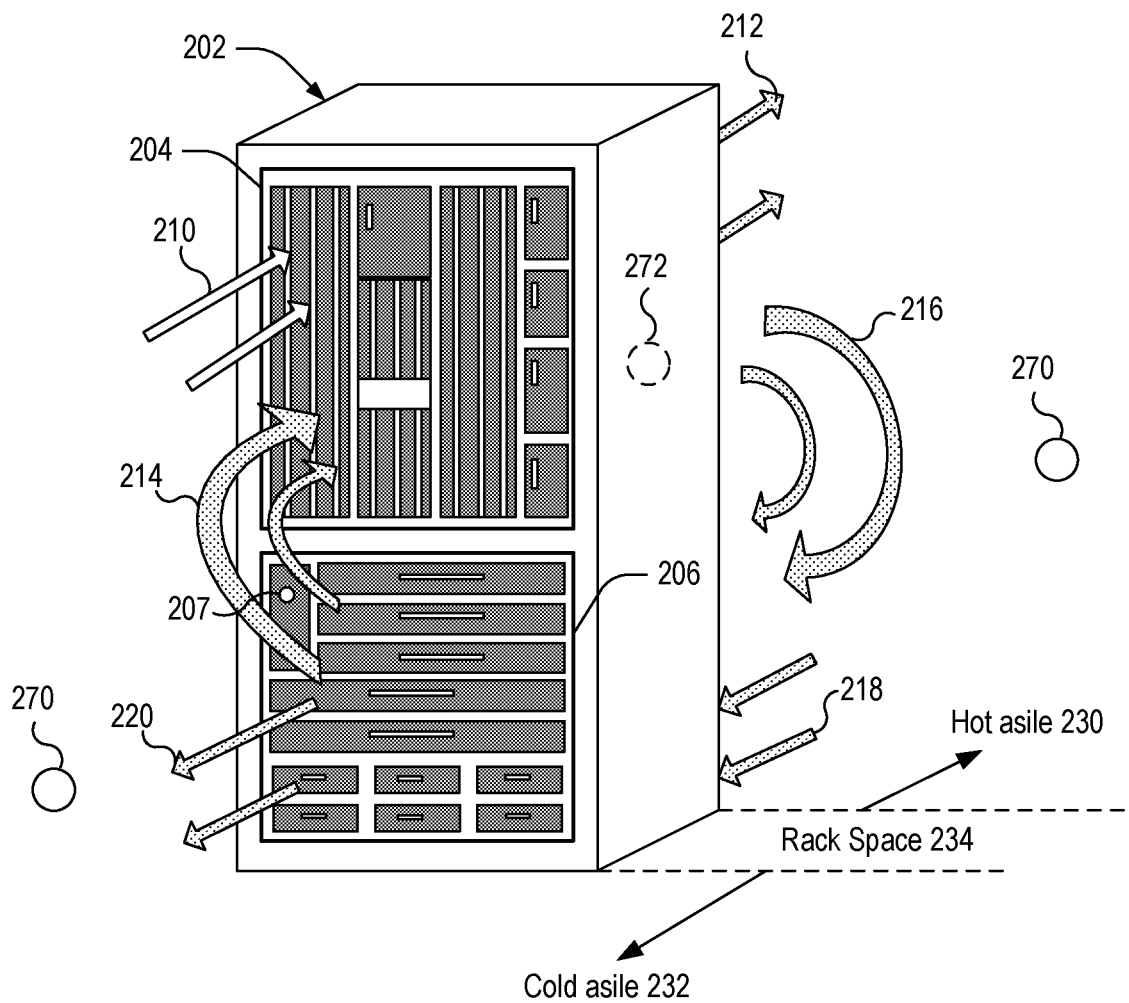
FIGS. 2A and 2B show a device that has a control unit to manually control the direction of air flow according to embodiments of the present disclosure.

FIG. 2A shows a device 206 installed in a rack 202, where the device 206 has a control unit to manually control the direction of air flow according to embodiments of the present disclosure. As depicted, one or more devices 204 and 206 are installed in the rack 202, where each device may include various air-cooled electronic components. For the purpose of illustration, only two devices are shown in FIG. 2A. However, it should be apparent to those of ordinary skill in the art that other suitable number of devices may be installed in the rack 202.

In embodiments, the rack 202 may be located inside an air-conditioned computer room, where the hot aisle 230 and cold aisle 232 are separated by the rack space 234. During operation, the device 204 may have one or more fans (not shown in FIG. 2A) that pull in cold air from the cold aisle 232 (as indicated by the arrows 210) and discharge hot air to the hot aisle 230 (as indicated by the arrows 212) after the cold air extracts heat energy from the electronic components inside the device 204. In embodiments, each of the devices in the rack 202 has one or more fans for generating the air flows 210 and 212. However, it should be apparent to those of ordinary skill in the art that each device may have other suitable type(s) of mechanism (or, air flow generator) that can generate the air flow across the device.

In embodiments, positioning of the devices (e.g., 206) with respect to the cool aisle 232 may be determined by various factors. For instance, the user may consider the efficient cabling of costly wires, from the front to the back of the rack 202, over the top of the rack, around corners or through the rack itself (cables are not shown in FIG. 2A). Upon considering these factors, the device 206 may be positioned in the rack 202 in such way that the fans of the device 206 pulls in hot air from the hot aisle 230 (as indicated by the arrows 218) and discharges heated air to the cold aisle 232 (as indicated by the arrows 220), If the device 206 pulls in hot air from the hot aisle 230 and discharges heated air to the cold aisle 232, a portion of the heated air 220 may be mixed with the cold air and pulled into the device 204, as indicated by the arrows 214. Likewise, a portion of the hot air 212 discharged by the device 204 may be pulled into the device 206 without having a chance to condition and cool, as indicated by arrows 216. The arrows 214 and 216 show the bidirectional air flow in and around the rack caused by the device 206. The bidirectional air flow may reduce the cooling efficiency of the rack 202 and, in some cases, cause damages to the electrical components of the devices 204 and 206.

In embodiments, the device 206 may have a control unit to change the direction of air flow across the device 206, where the control unit includes one or more interfaces, switches, controls, or buttons 207. It shall be noted that, in embodiments, the one or more interfaces, switches, controls, or buttons may be an actual interface, switch, control, or button or may be a soft (i.e., virtual) interface, switch, control, or button. In embodiments, the user may check the direction of the air flow across each device, and, if a device pulls in hot air from the hot aisle 230, the user may push the button of the control unit 207 to reverse the direction of the air flow, to thereby remove the bi-directional air flow around the rack 202.

In embodiments, the control unit to control the air flow direction may have a controller that is electrically coupled to the button 207 and reverses the fans when the user presses the button 207. In embodiments, the controller may be a processor coupled to the button 207 and the fans. In response to the "Press" signal from the button 207, the processor may send a signal to the fans in order to change (or reverse) the rotational direction of the fans. In embodiments, to avoid accidental touch/press of the button 207, the user needs to push the button 207 for a preset period of time (such as 10 seconds) before the control unit reverses the air flow. In embodiments, the button 207 may be used to reverse the air flow after the power has been applied to the device 206. In embodiments, the button 207 may be used to reverse the air flow after the power has been applied to the device 206 and the device 206 has been in normal operation for a while. Again, the button 207 may need to be pressed for a preset time period to ensure that it is not pressed accidentally.

Figure 2B:
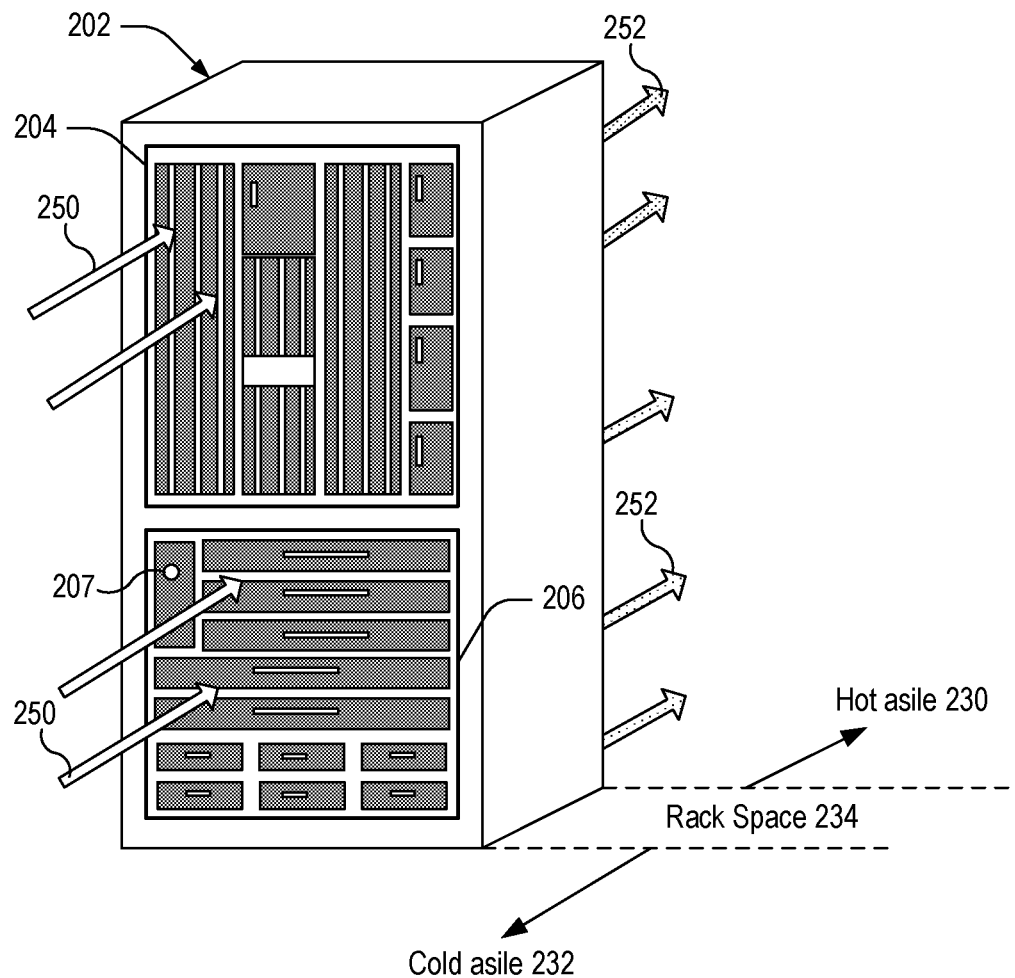

FIG. 2B shows the directions of air flows from the devices 204 and 206, where the user has reversed (or switched) the direction of air flow across the device 206 by operating the button 207. As depicted, the entire air flow across the rack 202 is unidirectional, i.e., both the devices 204 and 206 in the rack 202 pull in cold air from the cold aisle 232 in only one direction (as indicated by arrows 250) and discharge the warm air to the hot aisle 230 in only one direction (as indicated by arrows 252). Since the circulation of air in and around the rack due to the bidirectional air flow is removed, there would be no mixing between the cold air and hot air in the cold aisle 232, resulting in enhanced efficiency in cooling the devices in the rack 202.

It is noted that the control unit 207 allows the user to change the direction of the air flow without changing the position of the device 206 or the rack 202. Unlike the conventional systems where the user is sometimes forced to give up the efficient cabling in order to achieve efficient air flow, the user of the embodiments is able to achieve the ideal flow pattern in FIG. 2B without compromising the efficiency in cabling.

In embodiments, one or more sensors, such as lab thermometers, may be placed around racks (e.g., 270) and/or in the rack (e.g., 272) to determine ambient temperature. Based on the readings of the thermometers, the user may decide whether to change the air flow across each device for proper air flow around the rack 202. In FIG. 2A, only three sensors are shown. However, it should be apparent to those of ordinary skill in the art that other suitable number of sensors may be placed in and around the rack 202. Also, it should be apparent to those of ordinary skill in the art that the sensors are connected to a suitable controller that controls the sensors and provides the information of the measured ambient temperatures to the user.

In embodiments, the control unit of the device 206 may include a thermometer (e.g., 272) coupled to the controller. The controller continuously monitors the signals from the thermometer and sends a warning signal, such as simple network management protocol (SNMP) trap, each time the temperature goes beyond a preset threshold and prompts the user to monitor the situation that may lead to reversing the air flow.

Proper air flow in many electronic devices is crucial in order to maintain safe temperatures that will not cause errors in programs on the device or physical damage to the device itself. Electronic components in the electronic devices are becoming smaller and more dense on circuit card assemblies, backplane assemblies, and printed circuit board assemblies. These smaller components are more sensitive to high temperatures and require enhanced cooling techniques.

To properly cool the electronic components, as discussed above in conjunction with FIGS. 2A-2B, the user may need to check the air flow direction of each device and, if necessary, the user has to push the button 207 to manually change (or switch) the air flow direction. In some cases, operation of the manual button 207 may not be convenient to the user. For instance, if there is no hot/cold aisle, the user may not be able to decide which direction the air needs to go. In another example, it may be possible that the ambient temperature on one or more sides of the equipment changes due to newly installed equipment nearby, an AC malfunction, alterations in ambient air flow, etc. In such cases, the user may not be able to determine the proper air flow direction quickly. In yet another example, large computer rooms and data centers having a large number of racked equipment may require a considerable amount of time and effort to manually control all devices.

Figure 3A:
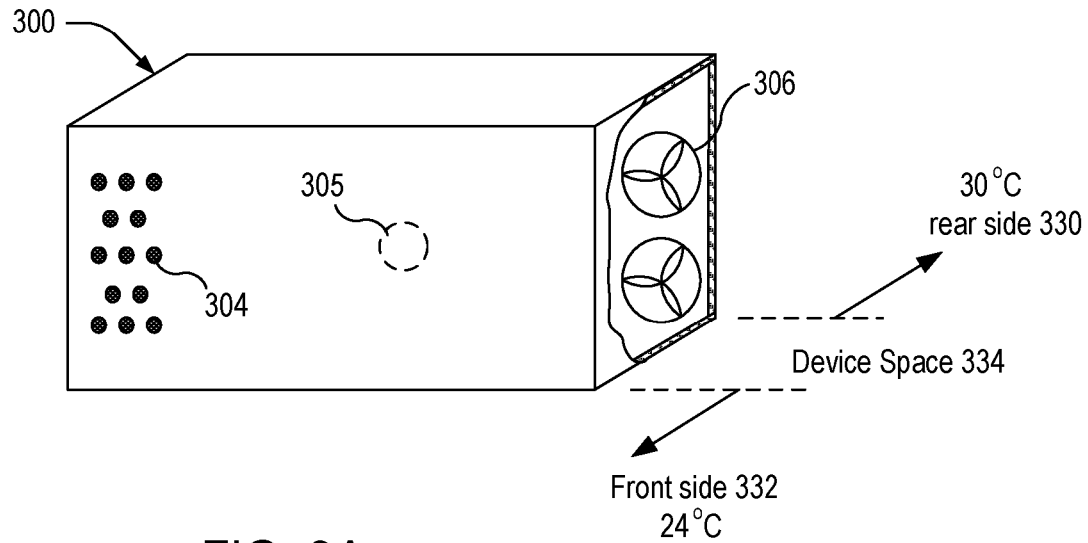
FIGS. 3A-3C show partial cutaway views of a device that has a control unit to automatically control the direction of air flow according to embodiments of the present disclosure.

In embodiment, where the operation of the manual button 207 is inconvenient, the manual button 207 may be replaced with a mechanism that automatically changes the direction of air flow. FIG. 3A shows a partial cutaway view of a device that has a control unit to automatically control the direction of air flow according to embodiments of the present disclosure. As depicted in FIG. 3A, the electronically air-cooled device (or, shortly, device) 300 may include: a vent 304 having one or more openings for air flow; one or more fans 306 for generating air flow through the device 300; and a control unit 305 coupled to the fans 306. The control unit 305 may include: a thermometer/thermocouple that measures the temperature of the air inside the device 300; and a controller that operates the thermometer and the fans 306.

Figure 3B:
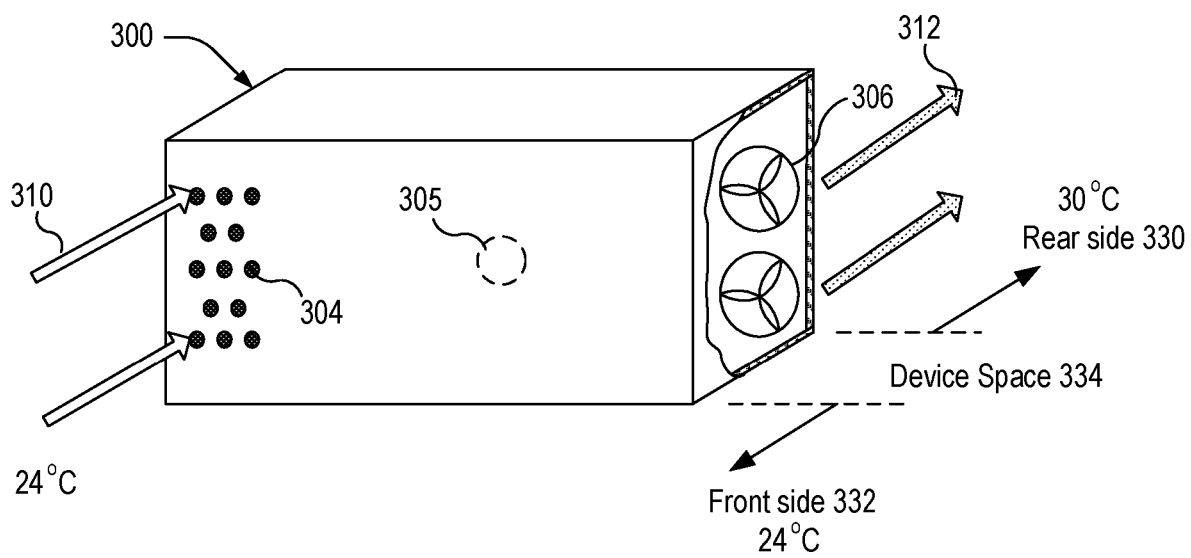
Figure 4:
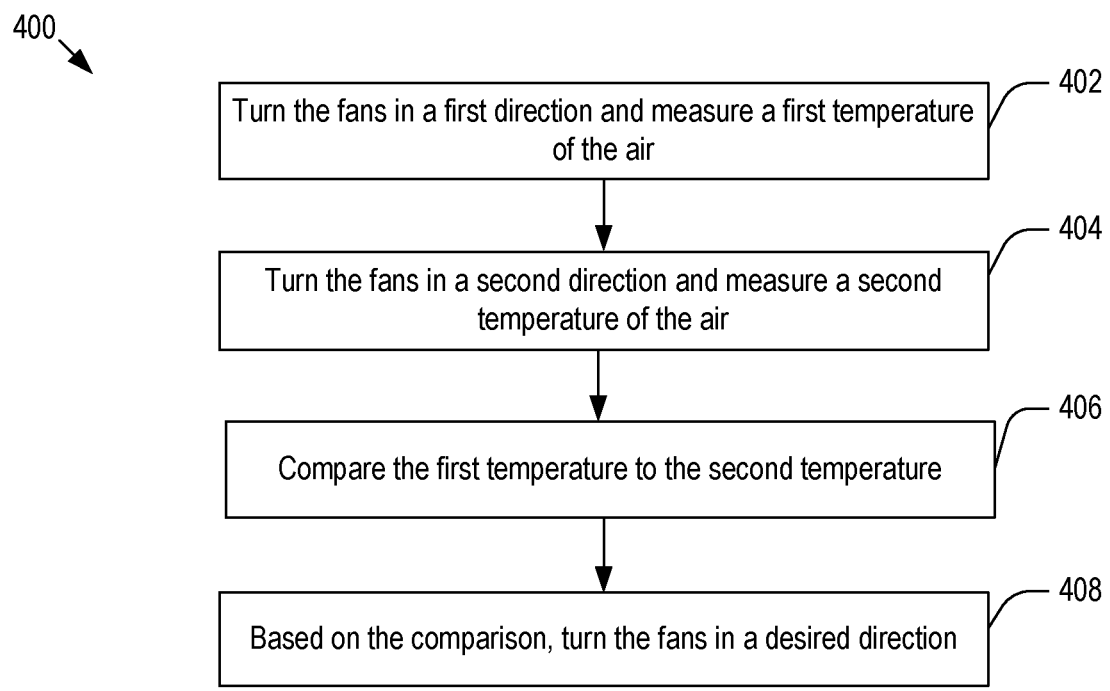
FIG. 4 shows a flowchart of an illustrative process for automatically controlling the direction of air flow across a device according to embodiments of the present disclosure.

FIG. 4 shows a flowchart 400 of an illustrative process for automatically controlling the direction of air flow through the device 300 according to embodiments of the present disclosure. At step 402, as depicted in FIG. 3B, the fans 306 may pull in air from the front side 332 through the vent 304 (as indicated by the arrows 310) and discharge the air to the rear side 330, where the front side 332 and the rear side 330 are separated by the device space 334. The control unit 305 may measure the first temperature of the air while the fans 306 are discharging the air to the rear side 312 and record the measured temperature.

Figure 3C:
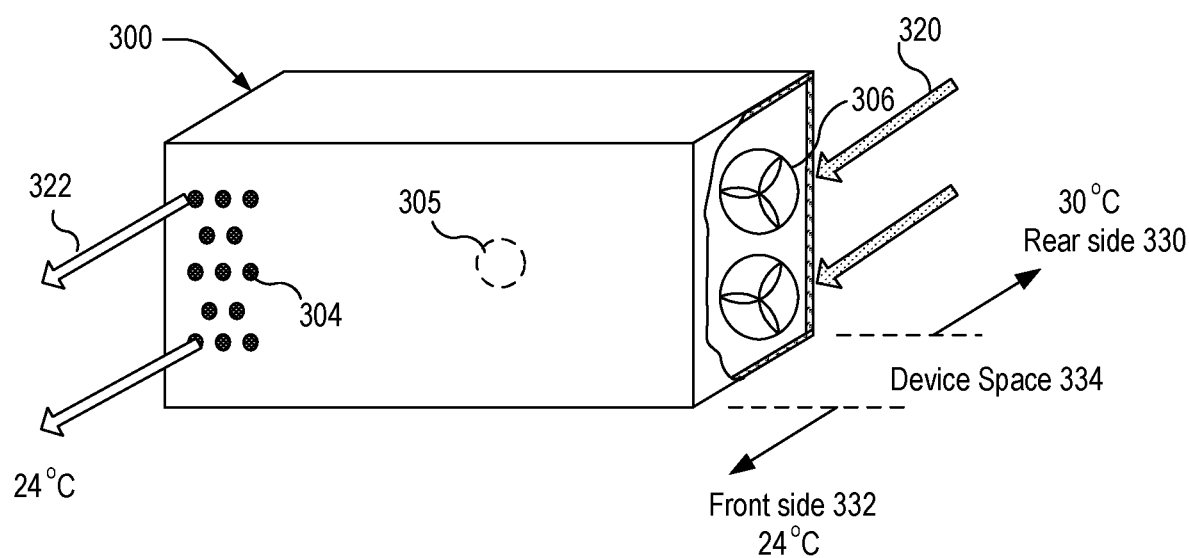

At step 404, as depicted in FIG. 3C, the control unit 305 may reverse the fans 306 (i.e., switch the air flow direction) so that the fans 306 may pull in air from the rear side 330 (as indicated by the arrows 320) and discharge the air to the front side 332 through the vent 304. The control unit 305 may measure and record the second temperature of the air while the fans 306 are discharging the air to the front side 332.

At step 406, the control unit 305 may compare the first temperature to the second temperature. Then, at step 408, based on the comparison, the control unit 305 may cause the fans 306 to blow the air only in the desired direction during the normal operation of the device 300. In the present example, the desired direction may be the direction that pulls in cold air from the front side 332 since the front side 332 is the colder aisle, as shown in FIG. 3B.

In embodiments, the processes in the flow chart 400 may be performed immediately after power is applied to the device 300. Alternatively, in embodiments, the process may be performed on a regular basis and change air flow direction as needed without cycling power on the device 300. Optionally, the control unit 305 may include an agent that sends a simple network management protocol (SNMP) trap each time the fans 306 change the flow direction and notify the user of a change in the ambient temperature surrounding the device 300. In embodiments, the agent may be hardware, software, firmware, or combination thereof, included in the control unit 305. In embodiments, the processes in the follow chart 400 may be automatically performed at regular time intervals. Alternatively, the user may initiate the processes in the flow chart 400.

The air-cooled devices described in conjunction with FIGS. 2A-4 change the direction of air flow from a first direction to a second direction so as to optimize the cooling. However, it is noted that the first direction of the air flow may not be necessarily opposite to the second direction of the air flow. In embodiments, the first direction may be different from the second direction, but may not be opposite to the second direction.

In embodiments, one or more computing system may be configured to perform one or more of the methods, functions, and/or operations presented herein. Systems that implement at least one or more of the methods, functions, and/or operations described herein may comprise an application or applications operating on at least one computing system. The computing system may comprise one or more computers and one or more databases. The computer system may be a single system, a distributed system, a cloud-based computer system, or a combination thereof.

It shall be noted that aspects of the present disclosure may be implemented in any instruction-execution/computing device or system capable of processing data, including, without limitation phones, laptop computers, desktop computers, and servers. The present disclosure may also be implemented into other computing devices and systems. Furthermore, aspects of the present disclosure may be implemented in a wide variety of ways including software (including firmware), hardware, or combinations thereof. For example, the functions to practice various aspects of the present disclosure may be performed by components that are implemented in a wide variety of ways including discrete logic components, one or more application specific integrated circuits (ASICs), and/or program-controlled processors. It shall be noted that the manner in which these items are implemented is not critical to the present disclosure.

Figure 5:
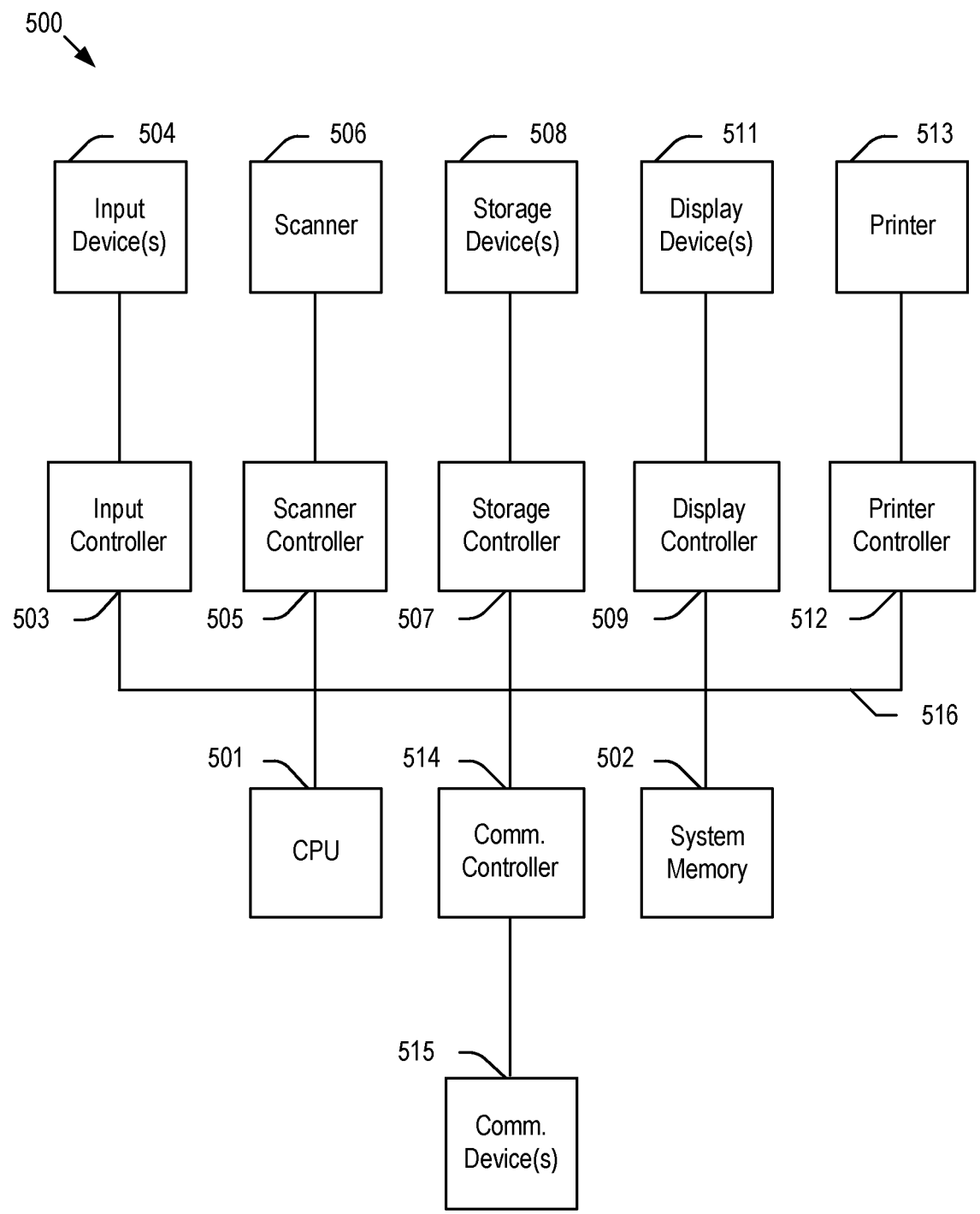
FIG. 5 shows a computer system according to embodiments of the present disclosure.

Having described the details of the disclosure, an exemplary system 500, which may be used to implement one or more aspects of the present disclosure, will now be described with reference to FIG. 5. Each device/equipment in FIGS. 2A-4 includes one or more components in the system 500. As illustrated in FIG. 5, system 500 includes a central processing unit (CPU) 501 that provides computing resources and controls the computer. CPU 501 may be implemented with a microprocessor or the like, and may also include a graphics processor and/or a floating point coprocessor for mathematical computations. System 500 may also include a system memory 502, which may be in the form of random-access memory (RAM) and read-only memory (ROM).

A number of controllers and peripheral devices may also be provided, as shown in FIG. 5. An input controller 503 represents an interface to various input device(s) 504, such as a keyboard, mouse, or stylus. There may also be a scanner controller 505, which communicates with a scanner 506. System 500 may also include a storage controller 507 for interfacing with one or more storage devices 508 each of which includes a storage medium such as magnetic tape or disk, or an optical medium that might be used to record programs of instructions for operating systems, utilities and applications which may include embodiments of programs that implement various aspects of the present disclosure. Storage device(s) 508 may also be used to store processed data or data to be processed in accordance with the disclosure. System 500 may also include a display controller 509 for providing an interface to a display device 511, which may be a cathode ray tube (CRT), a thin film transistor (TFT) display, or other type of display. System 500 may also include a printer controller 512 for communicating with a printer 513. A communications controller 514 may interface with one or more communication devices 515, which enables system 500 to connect to remote devices through any of a variety of networks including the Internet, an Ethernet cloud, an FCoE/DCB cloud, a local area network (LAN), a wide area network (WAN), a storage area network (SAN) or through any suitable electromagnetic carrier signals including infrared signals.

In the illustrated system, all major system components may connect to a bus 516, which may represent more than one physical bus. However, various system components may or may not be in physical proximity to one another. For example, input data and/or output data may be remotely transmitted from one physical location to another. In addition, programs that implement various aspects of this disclosure may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present disclosure may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present disclosure may further relate to computer products with a non-transitory, tangible computer-readable medium that have computer code thereon for performing various computer-implemented operations. The media and computer code may be those specially designed and constructed for the purposes of the present disclosure, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present disclosure may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiment are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure.

What is claimed is:

1. An information handling system, comprising:
   a housing;
   one or more communication interfaces for communicatively coupling the information handling system to one or more other systems;
   a processing subsystem for processing data that is sent or received via at least one of the one or more communication interfaces;
   an air flow generator that is able to generate an air flow through at least part of the information handling system in a first direction and in a second direction that is different from the first direction;
   a physical user interface accessible outside of the housing; and
   a controller communicatively coupled to the physical user interface and the air flow generator, in which the controller causes the air flow generator to switch a direction of the air flow between the first and second directions in response to activation of the physical user interface by a user for at least a pre-set threshold interval, which overrides a current direction of the air flow.

2. The information handling system as recited in claim 1, wherein the air flow generator includes at least one fan and a rotational direction of the at least one fan is reversed to change the direction of the air flow.

3. The information handling system as recited in claim 2, further comprising:
   at least one vent that forms a passageway of the air flow and allows air to flow through at least part of the information handling system.

4. The information handling system as recited in claim 1, further comprising:
   a temperature measuring sensor that is communicatively coupled to the controller and that measures a temperature of air.

5. The information handling system as recited in claim 4, wherein the controller receives a signal from the temperature measuring sensor and prompts a warning signal when the temperature reaches a pre-set threshold.

6. The information handling system as recited in claim 4, wherein the controller is communicatively coupled to the temperature measuring sensor and the controller:
   causes the air flow generator to generate the air flow in the first direction and receives a first temperature from the temperature measuring sensor;
   causes the air flow generator to generate the air flow in the second direction and receives a second temperature from the temperature measuring sensor;
   compares the first temperature to the second temperature; and
   controls the air flow generator to generate the air flow in one of the first and second directions based on the comparison of the first temperature to the second temperature.

7. A device comprising:
   an air flow generator that is able to generate air flow in first and second directions;
   a sensor that provides a first air temperature measurement when air flows in the first direction and a second air temperature measurement when air flows in the second direction; and
   a controller, communicatively coupled to the air flow generator and the sensor, that is configured to:
   receive the first air temperature measurement and the second air temperature measurement;
   compare the first air temperature measurement to the second air temperature measurement; and
   cause the air flow generator to generate the air flow in one of the first and second directions based on comparison of the first air temperature measurement and the second air temperature measurement and causes the air flow generator to switch a direction of the air flow between the first and second directions in response to activation of a physical user interface by a user for at least a pre-set threshold interval.

8. The device of claim 7, wherein the air flow generator includes at least one fan and a rotational direction of the at least one fan is reversed to change a direction of the air flow.

9. The device of claim 7, wherein activation of the physical user interface causes the controller controlling the air flow generator to switch the direction of the air flow to overrides the direction that was based upon the comparison of the first air temperature measurement and the second air temperature measurement.

10. The device of claim 9, wherein the controller is further configured to cause a notification to be generated when the air flow generator changes a direction of the air flow.

11. The device of claim 7, wherein the controller is further configured to provide a warning signal when an air temperature measurement equals or exceeds a pre-set threshold temperature.

12. The information handling system as recited in claim 6 wherein the controller is further configured to perform the comparison of the first temperature and the second temperature according to a schedule, according to specific events, periodically, or a combination thereof.

13. The information handling system as recited in claim 12 wherein activation of the physical user interface causes the controller controlling the air flow generator to switch the direction of the air flow to overrides the direction that was based upon the comparison of the first air temperature measurement and the second air temperature measurement.

14. The information handling system as recited in claim 12, wherein the information handling system is configured to cause a notification to be generated when the air flow generator changes a direction of the air flow.

15. The information handling system as recited in claim 1 wherein the controller comprises a processor that is part of the processing subsystem.

16. A controller for controlling an air flow generator that is able to generate an air flow in a first direction and in a second direction that is different from the first direction, the controller comprising:
   a first connector for coupling to the air flow generator;
   a second connector for coupling to a physical user interface;
   wherein the controller causes the air flow generator to switch a direction of the air flow between a first direction and a second direction in response to activation of the physical user interface by a user for at least a pre-set threshold interval.

17. The controller of claim 16 wherein the controller is further configured to:
   receive one or more air temperature measurements from one or more sensors.

18. The controller of claim 17 wherein the controller is further configured to:
   receive a first air temperature measurement and a second air temperature measurement;
   compare the first air temperature measurement to the second air temperature measurement;

cause the air flow generator to generate the air flow in one of the first and second directions based on comparison of the first air temperature measurement and the second air temperature measurement.

19. The controller of claim 17, wherein the controller is further configured to:
cause a warning signal to be generated when an air temperature measurement reaches a pre-set threshold.

20. The controller of claim 16, wherein the controller is further configured to:
cause a notification to be generate when the air flow generator changes a direction of the air flow.

* * * * *